United States Patent
Park et al.

(10) Patent No.: US 10,665,483 B2
(45) Date of Patent: May 26, 2020

(54) APPARATUS FOR TREATING A SUBSTRATE

(71) Applicant: Samsung Electronics Co., Ltd., Suwon-si, Gyeonggi-do (KR)

(72) Inventors: Gi-Nam Park, Incheon (KR); Bokyung Jung, Seoul (KR); Leekwon Gil, Yongin-si (KR); Jungwoo Seo, Hwaseong-si (KR); Dongseok Baek, Hwaseong-si (KR); Nam Hoon Lee, Ansan-si (KR); Jonghyun Lee, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 839 days.

(21) Appl. No.: 15/250,186

(22) Filed: Aug. 29, 2016

(65) Prior Publication Data

US 2017/0098563 A1 Apr. 6, 2017

(30) Foreign Application Priority Data

Oct. 5, 2015 (KR) ........................ 10-2015-0139727

(51) Int. Cl.
   *H01L 21/67* (2006.01)
   *H01L 21/687* (2006.01)
   *H05B 3/00* (2006.01)

(52) U.S. Cl.
   CPC .... *H01L 21/67115* (2013.01); *H01L 21/6875* (2013.01); *H01L 21/68735* (2013.01); *H01L 21/68785* (2013.01); *H05B 3/0047* (2013.01)

(58) Field of Classification Search
   CPC ......... H01L 21/67115; H01L 21/68735; H01L 21/6875; H01L 21/68785; H05B 3/0047

USPC ......... 118/725, 724; 156/345.52; 219/121.43
See application file for complete search history.

(56) References Cited

U.S. PATENT DOCUMENTS

| | | | |
|---|---|---|---|
| 6,482,331 B2 | 11/2002 | Lu et al. | |
| 7,050,710 B2 | 5/2006 | Shinya et al. | |
| 7,691,208 B2 | 6/2010 | Maekawa | |
| 7,740,706 B2 | 6/2010 | Park et al. | |
| 8,443,484 B2 | 5/2013 | Ozaki et al. | |
| 2004/0180141 A1* | 9/2004 | Kobayashi ............. | B05D 1/005 427/240 |

FOREIGN PATENT DOCUMENTS

| | | |
|---|---|---|
| JP | H1050615 | 2/1998 |
| JP | H11335848 | 12/1999 |

(Continued)

*Primary Examiner* — Ibrahime A Abraham
*Assistant Examiner* — Biniam B Asmelash
(74) *Attorney, Agent, or Firm* — Myers Bigel, P.A.

(57) ABSTRACT

An apparatus for treating a substrate includes a chamber including a space in which a substrate is treated, a support member disposed in the chamber and supporting the substrate, and a heating member for heating the substrate. The space is divided into an upper space and a lower space by the support member. The support member includes a support plate receiving the substrate, a base supporting the support plate, exposing a bottom surface of the support plate and including a cut region formed in an edge portion of the base, and an adjustment block held in the cut region and coupled to the base. The cut region fluidly connects the upper space to the lower space. The adjustment block divides the cut region into a plurality of vents.

8 Claims, 18 Drawing Sheets

(56) References Cited

FOREIGN PATENT DOCUMENTS

| JP | 2007266229 | 10/2007 |
|----|------------|---------|
| KR | 1019990069670 | 9/1999 |
| KR | 1020060075596 | 7/2006 |
| KR | 1020140002452 | 1/2014 |

* cited by examiner

APPARATUS FOR TREATING A SUBSTRATE

CROSS-REFERENCE TO RELATED APPLICATION

This U.S. non-provisional patent application claims priority under 35 U.S.C. § 119 to Korean Patent Application No. 10-2015-0139727, filed on Oct. 5, 2015, the disclosure of which is hereby incorporated by reference in its entirety.

BACKGROUND

The inventive concepts relate to an apparatus for treating a substrate and, more particularly, to a support member dividing a chamber and an apparatus that includes the same and is used to thermally treat a substrate.

An annealing process may be performed after an ion implantation process of semiconductor manufacturing processes is performed. The annealing process may correspond to a thermal treatment process performed at a high temperature. The annealing process may activate implanted dopants and may prevent diffusion of the dopants.

In general, a rapid thermal annealing (RTA) process such as a millisecond annealing process may be used as the annealing process. In the millisecond annealing process, radiant heat energy may be emitted from a lamp so as to be transmitted to a wafer for a short time (millisecond level).

SUMMARY

Embodiments of the inventive concepts may provide an apparatus of treating a substrate, which is capable of efficiently performing a thermal treatment process while preventing contamination on a substrate in a chamber.

In an aspect, an apparatus for treating a substrate may include a chamber including a space in which a substrate is treated, a support member disposed in the chamber and supporting the substrate, and a heating member configured to heat the substrate. The space may be divided into an upper space and a lower space by the support member. The support member may include a support plate receiving the substrate, a base supporting the support plate and exposing a bottom surface of the support plate, the base including a cut region formed in an edge portion of the base, and an adjustment block held in the cut region and coupled to the base. The cut region may fluidly connect the upper space to the lower space, and the adjustment block may divide the cut region into a plurality of vents.

In some embodiments, the cut region may have a groove shape defined by an outer side surface of the base that may be recessed toward a central portion of the base.

In some embodiments, the chamber may include a top wall, a bottom wall, and a side wall between the top wall and the bottom wall. The base may be on the side wall such that a slit is defined by the cut region and the side wall. The vents may correspond to portions of the slit.

In some embodiments, the side wall may include first to fourth side walls, an open top end and an open bottom end. The cut region may be a first cut region. The slit may be a first slit that may be defined by the first cut region and the first side wall. The base may further include second to fourth cut regions. Second to fourth slits may be defined by the second to fourth side walls and the second to fourth cut regions, respectively.

In some embodiments, a plurality of adjustment blocks may be provided, and at least one of the adjustment blocks may be inserted in each of the first to fourth cut regions. The first slit may be defined by the first cut region between the first side wall and the adjustment block held in the first cut region. The second slit may be defined by the second cut region between the second side wall and the adjustment block held in the second cut region. The third slit may be defined by the third cut region between the third side wall and the adjustment block held in the third cut region. The fourth slit may be defined by the fourth cut region between the fourth side wall and the adjustment block held in the fourth cut region.

In some embodiments, the support member may further include a blocking plate disposed on the base to divide the upper space into a first upper space and a second upper space. The blocking plate may include a connection hole adjacent one edge of the blocking plate, and the first upper space and the second upper space may be fluidly connected to each other through the connection hole.

In some embodiments, the connection hole may have a rectangular shape extending along the one edge of the blocking plate.

In some embodiments, a width of the connection hole may range from 1.7 mm to 3.3 mm.

In some embodiments, the chamber may include first to fourth side walls, an open top end and an open bottom end. The first and third side walls may be opposite from each other. The second and fourth side walls may be opposite from each other and may be substantially perpendicular to the first and third side walls. The plurality of vents may be adjacent the first side wall, and the connection hole of the blocking plate may be adjacent the third side wall.

In some embodiments, the blocking plate may be formed of a material configured to transmit light that is provided from the heating member.

In some embodiments, a portion of the chamber defining the upper space may be an upper chamber, and another portion of the chamber defining the lower space may be a lower chamber. The apparatus may be configured to move a gas provided in the upper chamber into the lower chamber through the plurality of vents. A plurality of gas supply ports may be connected to the upper chamber, and a plurality of exhaust ports may be connected to the lower chamber. Each of the gas supply ports may be connected to a gas supply pipe and is configured to provide an inert gas into the upper space, and each of the exhaust ports may be connected to an exhaust pipe and is configured to exhaust a gas of the lower space.

In some embodiments, the chamber may include a top wall, a bottom wall, and a side wall between the top wall and the bottom wall. The side wall may include first to fourth side walls and may have an open top end and an open bottom end. The first and third side walls may face each other. The second and fourth side walls may face each other and may be substantially perpendicular to the first and third side walls. The plurality of gas supply ports may include first and second spaced apart gas supply ports adjacent upper corners of the first side wall, respectively, and third and fourth spaced apart gas supply ports adjacent upper corners of the third side wall.

In some embodiments, the first and third side walls may face each other in a first direction, and each of the first and third side walls may have a length along a second direction intersecting the first direction and a height along a third direction perpendicular to the first and second directions. The first gas supply port may be tilted downwardly toward a center of the upper space so as to be parallel to a fourth direction, and the second gas supply port may be tilted downwardly toward the center of the upper space so as to be parallel to a fifth direction. The third gas supply port may be tilted downwardly toward the center of the upper space so as to be parallel to a sixth direction, and the fourth gas supply port may be tilted downwardly toward the center of the upper space so as to be parallel to a seventh direction. Each of the fourth to seventh directions may not be parallel to the first to third directions.

In some embodiments, the chamber may include a top wall, a bottom wall, and a side wall between the top wall and the bottom wall, and the side wall may include first to fourth side walls and may have an open top end and an open bottom end. The first and third side walls may face each other. The second and fourth side walls may face each other and may be substantially perpendicular to the first and third side walls. The plurality of gas supply ports may include a first gas supply port adjacent an upper corner of the first side wall, a second gas supply port spaced apart from the first gas supply port and adjacent an upper corner of the second side wall, a third gas supply port spaced apart from the second gas supply port and adjacent an upper corner of the third side wall, and a fourth gas supply port spaced apart from the first gas supply port and adjacent an upper corner of the fourth side wall.

In some embodiments, a plurality of adjustment blocks may be provided, and the plurality of adjustment blocks may be held in the cut region and are spaced apart from each other.

In some embodiments, the adjustment block may be movable along a width direction of the cut region.

In some embodiments, the cut region may have an open hole shape surrounded on all sides by the base.

In some embodiments, the heating member may include an upper lamp disposed above the support member, and a lower lamp disposed below the support member.

In some embodiments, each of the upper and lower lamps may include an arc lamp.

In another aspect, an apparatus for treating a substrate may include a chamber, a support member, a plurality of gas supply ports and at least one exhaust port. The chamber includes a top wall, a bottom wall and a side wall defining an inner space. The support member is held in the chamber and divides the inner space into an upper inner space and a lower inner space. The support member includes a base and a support plate. The base includes at least one cut region at a peripheral portion thereof, with the upper inner space and the lower inner space in fluid communication via the at least one cut region. The support plate is on the base and is configured to hold a substrate. The plurality of gas supply ports extend through the chamber side wall and are configured to inject an inert gas into the upper inner space. The at least one exhaust port extends through the chamber side wall is and configured to exhaust gas from the lower inner space.

In some embodiments, the side wall may include first to fourth side walls with the first and third side walls being parallel and facing one another and the second and fourth side walls being parallel and facing one another. The at least one cut region may include first to fourth cut regions with the first cut region adjacent the first side wall, the second cut region adjacent the second side wall, the third cut region adjacent the third side wall and the fourth cut region adjacent the fourth side wall. An adjustment block may be held on each of the cut regions to divide the cut region into a plurality of vents.

In some embodiments, a blocking plate may be held in the chamber substantially parallel to the top and bottom walls and dividing the upper space into a first upper space and a second upper space. The blocking plate may include a communication hole at a peripheral portion thereof with the first upper space and the second upper space in fluid communication via the communication hole. The at least one cut region may be on one side of the chamber and the communication hole may be on an opposite side of the chamber with the support plate between the at least one cut region and the communication hole.

In some embodiments, the side wall may be generally rectangular or square and include first to fourth corners. The plurality of gas supply ports may include first to fourth gas supply ports with the first gas supply port adjacent the first corner of the side wall, the second gas supply port adjacent the second corner of the side wall, the third gas supply port adjacent the third corner of the side wall and the fourth gas supply port adjacent the fourth corner of the side wall.

In another aspect, an apparatus for treating a substrate may include a chamber including a top wall, a bottom wall, and a side wall between the top wall and the bottom wall, the chamber defining an inner space in which a substrate is treated, a support member disposed in the chamber, the support member supporting the substrate, one or more upper lamps above the top wall, and one or more lower lamps below the bottom wall. The inner space of the chamber may be divided into an upper space and a lower space by the support member. The support member may include a support plate receiving the substrate, a base including a cut region formed in an edge portion of the base, the base held on the side wall and supporting the support plate, and a blocking plate including a connection hole formed along one edge of the blocking plate. The blocking plate may be disposed over the base to divide the upper space into a first upper space and a second upper space. The connection hole may fluidly connect the first upper space and the second upper space to each other, and the cut region may form a vent fluidly connecting the second upper space and the lower space to each other.

In some embodiments, the blocking plate may be disposed such that the connection hole is at one side of the chamber and the vent is at an opposite side of the chamber with the support plate interposed therebetween.

In some embodiments, the side wall may include first to fourth side walls and may have an open top end and an open bottom end. The first and third side walls may be opposite from each other. The second and fourth side walls may be opposite from each other and may be substantially perpendicular to the first and third side walls. The cut region may be adjacent the first side wall, and the connection hole may be adjacent the third side wall.

In some embodiments, the cut region may have a groove shape defined by an outer side surface of the base that is laterally recessed toward a central portion of the base, and the vent may include a slit defined by the cut region and the side wall.

In some embodiments, the cut region may have an open hole shape with the base surrounding all sides of the cut region.

In some embodiments, the base may include a through-hole formed in a central portion of the base, and a mount portion extending laterally from a side surface of the through-hole toward a center of the through-hole. The support plate may be disposed on the mount portion.

In some embodiments, each of the support plate and the blocking plate may be formed of a material configured to transmit light that is provided from the upper lamps or the lower lamps.

In some embodiments, the support member may further include an adjustment block inserted in the cut region so as to be coupled to the base. The adjustment block may divide the cut region into a plurality of vents.

In some embodiments, the adjustment block may be movable along a width direction of the cut region.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
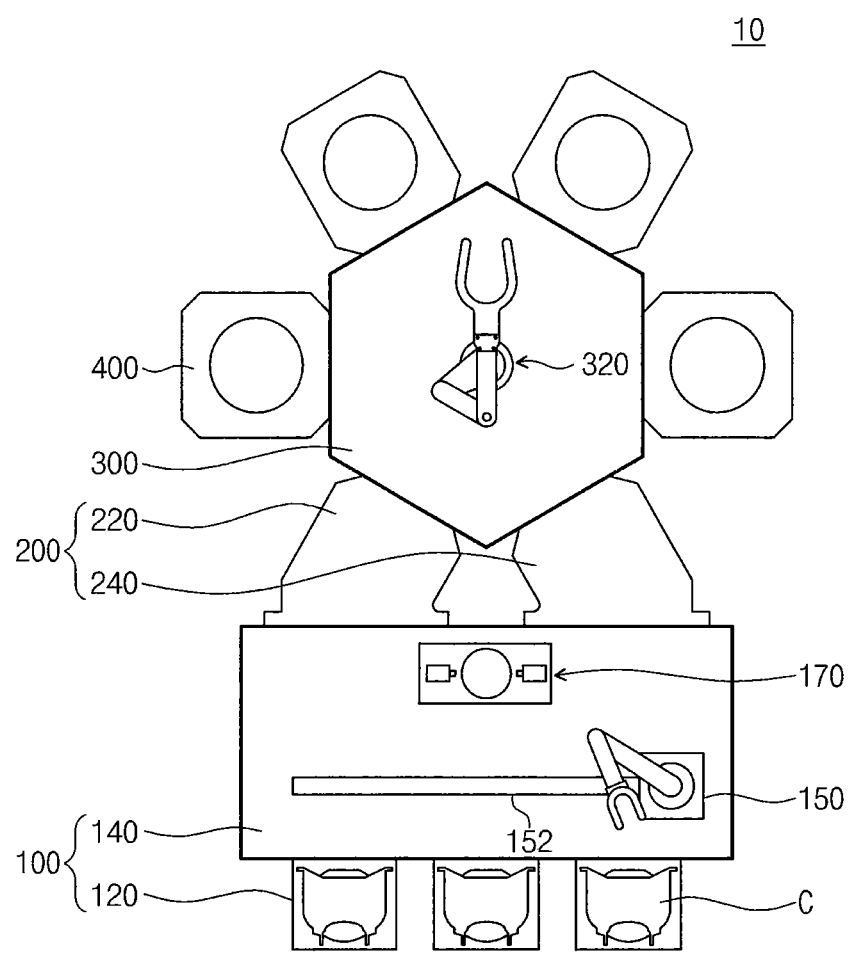
FIG. 1 is a plan view illustrating cluster equipment for thermally treating a substrate.

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of aspects of the present inventive concepts explained and illustrated herein include their complementary counterparts. The same reference numerals or the same reference designators denote the same elements throughout the specification.

FIG. 1 is a plan view illustrating cluster equipment for thermally treating a substrate.

Referring to FIG. 1, cluster equipment 10 for thermally treating a substrate may include an equipment front end module (EFEM) 100, a load lock chamber 200, a transfer chamber 300, and treating modules 400.

The equipment front end module 100 may include a plurality of load ports 120 and a frame 140. The load ports 120 may be arranged (e.g., spaced apart) in one direction and the frame 140 may be disposed between the load lock chamber 200 and the load ports 120. Each of containers C receiving wafers may be an airtight container such as a front open unified pod (FOUP). The containers C may be loaded on the load ports 120.

A door opener, a first transfer robot 150, and a wafer alignment unit 170 may be installed in the frame 140. The door opener may automatically open and/or close doors of the containers C loaded on the load ports 120. The first transfer robot 150 may be movable along a transfer rail 152 and may transfer a wafer between the load lock chamber 200 and the containers C loaded on the load ports 120. In some embodiments, in an operation of loading a wafer, the first transfer robot 150 may transfer a wafer from the container C into the wafer alignment unit 170 and may transfer the wafer from wafer alignment unit 170 into the load chamber 200. In an operation of unloading a wafer, the first transfer robot 150 may transfer a wafer from the load lock chamber 200 into the container C. The wafer alignment unit 170 may detect a defect of a wafer and/or crystal orientation of a wafer and may align the wafer in such a way that the defect and/or the crystal orientation faces a predetermined direction.

The load lock chamber 200 may be disposed in the rear of the equipment front end module 100. The load lock chamber 200 may include a loading chamber 220 and an unloading chamber 240. Wafers to be loaded into the treating modules 400 for performing a process may temporarily stay (e.g., be held) in the loading chamber 220, and wafers unloaded from the treating modules 400 may temporarily stay (e.g., be held) in the unloading chamber 240 after a process is completed. When an aligned wafer is provided in the loading chamber 220, an inner pressure of the loading chamber 220 may be reduced to an initial low-vacuum state by a controller. Thus, it is possible to prevent an external contaminant from flowing into the transfer chamber 300 and the treating modules 400.

The transfer chamber 300 may be disposed to be adjacent one side of the load lock chamber 200, and the treating modules 400 may be disposed around the transfer chamber 300. A second transfer robot 320 for transferring a wafer may be provided in the transfer chamber 300. The second transfer robot 320 may transfer a wafer between the load lock chamber 200 and the treating modules 400.

Each of the treating modules 400 may provide a treating space in which a rapid thermal annealing process of a wafer is performed. For example, the rapid thermal annealing process may be a flash lamp annealing process. The flash lamp annealing process may heat a wafer using radiant heat energy of a lamp for a short time (e.g., millisecond level). In some embodiments, dopants implanted in a wafer may be activated by heating the wafer using the flash lamp annealing process.

Entrances through which a wafer is moved may be provided between the load lock chamber 200 and the transfer chamber 300 and between the transfer chamber 300 and the treating modules 400. The entrances may be opened and closed by doors. The doors may interrupt inflow of a gas or impurity through the entrances and may prevent pressure transfer between chambers.

In the present specification, the treating modules 400 may be defined as apparatuses 400 for treating a substrate (hereinafter, referred to as "a substrate treating apparatus 400"). Hereinafter, a thermal treatment apparatus for performing a flash annealing process will be described as an embodiment of the substrate treating apparatus 400 according to some embodiments of the inventive concepts. However, embodiments of the inventive concepts are not limited thereto. The substrate treating apparatus 400 according to some embodiments of the inventive concepts may be applied to other thermal treatment processes instead of the flash annealing process. In addition, a wafer used to manufacture a semiconductor chip will be described as an example of the substrate. However, embodiments of the inventive concepts are not limited thereto. In certain embodiments, the substrate may be a panel (e.g., a glass substrate) used to manufacture a flat display. Hereinafter, substrate treating apparatuses 400 according to some embodiments of the inventive concepts will be described in detail with reference to the drawings.

Figure 2:
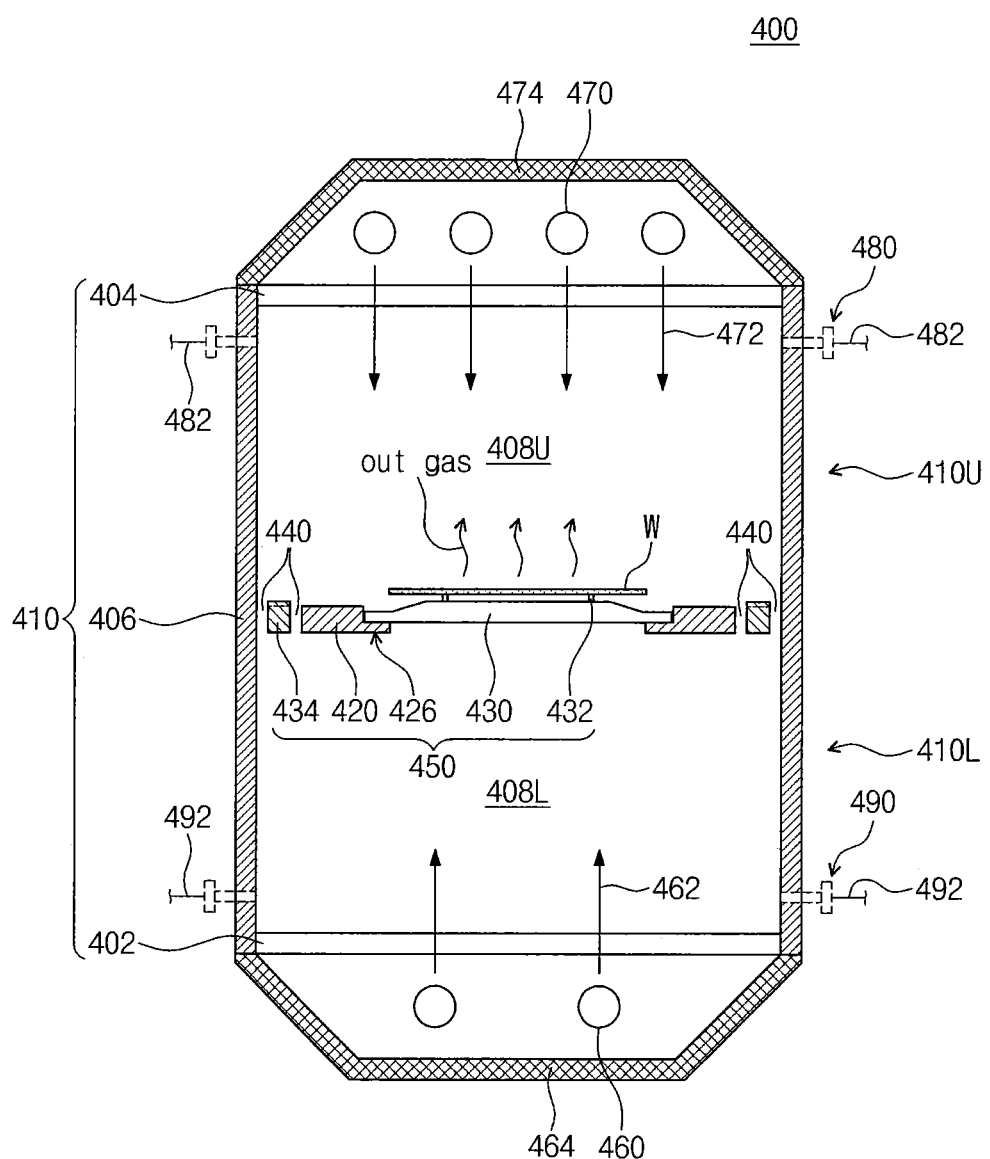
FIG. 2 is a cross-sectional view schematically illustrating an apparatus for treating a substrate, according to some embodiments of the inventive concepts.
Figure 3:
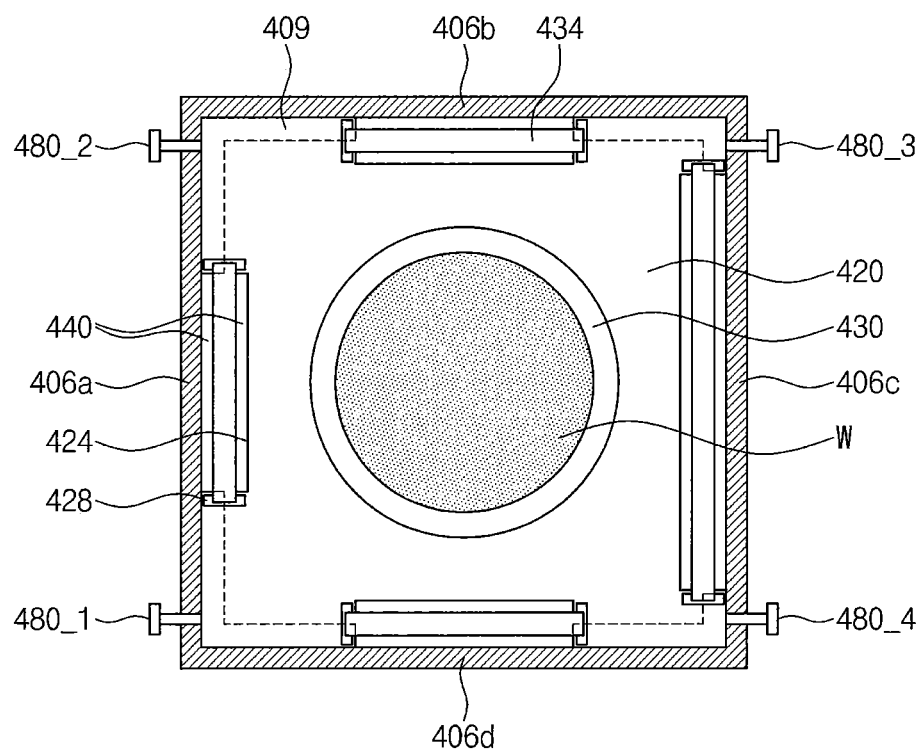
FIG. 3 is a plan view illustrating a portion of the apparatus of FIG. 2.
Figure 4:
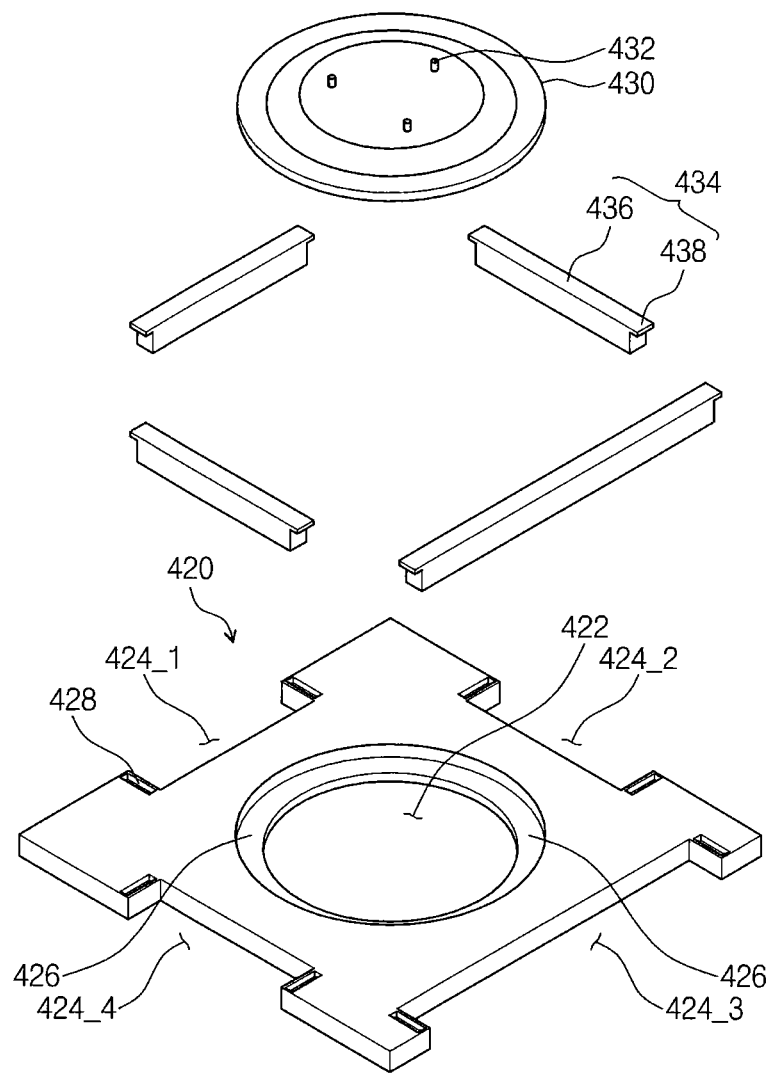
FIG. 4 is an exploded perspective view illustrating a support member of FIG. 2.
Figure 5:
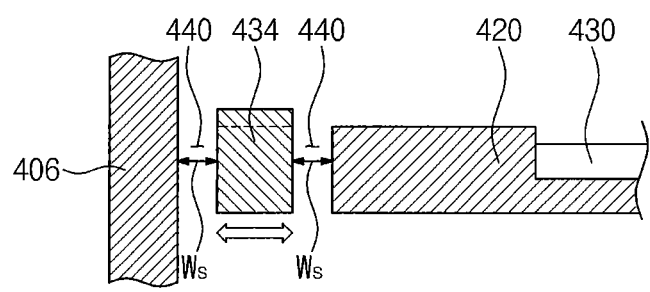
FIG. 5 is an enlarged cross-sectional view illustrating a portion of the support member of FIG. 2.

FIG. 2 is a cross-sectional view schematically illustrating an apparatus for treating a substrate, according to some embodiments of the inventive concepts. FIG. 3 is a plan view illustrating a portion of the apparatus of FIG. 2. FIG. 4 is an exploded perspective view illustrating a support member of FIG. 2. FIG. 5 is an enlarged cross-sectional view illustrating a portion of the support member of FIG. 2.

Referring to FIGS. 2 to 5, a substrate treating apparatus 400 may include a chamber 410, a support member 450, and a heating member. The chamber 410 may provide a thermal treatment space in which an annealing process (e.g., a flash annealing process) is performed on a substrate W. The support member 450 may be disposed in a central portion of the chamber 410 and may support a substrate W. The heating member may include lower lamps 460 disposed below the support member 450 and upper lamps 470 disposed above or over the support member 450. The lower lamps 460 may provide lower light 462 to a substrate W, and the upper lamps 470 may provide upper light 472 to a substrate W. In the annealing process, a substrate W may be heated by the lower lamps 460 and the upper lamps 470.

The chamber 410 may define or provide an inner space sealed from the outside. In some embodiments, the chamber 410 may have a substantially rectangular parallelepiped shape. In some embodiments, the chamber 410 may include a bottom wall (or a bottom plate) 402, a top wall (or a top plate) 404, and a side wall 406. The side wall 406 may include first, second, third and fourth side walls 406a, 406b, 406c and 406d which constitute a hexahedral tube shape having an open top end and an open bottom end. The first and third side walls 406a and 406c may face each other, and the second and fourth side walls 406b and 406d may face each other. The second and fourth side walls 406b and 406d may be substantially perpendicular to the first and third side walls 406a and 406c. An entrance through which a substrate W is moved may be formed in the third side wall 406c, and a door may close and open the entrance. Each of the first to fourth side walls 406a to 406d may be connected between the bottom wall 402 and the top wall 404.

Each of the bottom wall 402 and the top wall 404 may be formed of a material capable of transmitting light. In other words, the lower light 462 and the upper light 472 may be transmitted through the bottom wall 402 and the top wall 404, respectively. For example, the bottom wall 402 and the top wall 404 may be formed of quartz. The side wall 406 may be formed of a metal (e.g., aluminum). In addition, a reflective plate or a reflective coating layer may be provided on an inner side surface of the side wall 406. Thus, the inner side surface of the side wall 406 may reflect the lower light 462 and the upper light 472 to the inner space of the chamber 410.

The lower lamps 460 may be disposed on or under the bottom wall 402 of the chamber 410 and may bulk-heat a substrate W at a first temperature. In some embodiments, the first temperature may be about 850° C. In other words, a substrate W may be heated from a room temperature to about 850° C. for several seconds (e.g., for about 6 seconds) by the lower light 462. Each of the lower lamps 460 may include an arc lamp. The lower lamps 460 may have bar shapes and may be disposed parallel to each other. The lower lamps 460 may be provided in a plane parallel to a substrate W loaded on the support member 450. A lower reflective housing 464 may be provided under the lower lamps 460. The lower reflective housing 464 may reflect the lower light 462 of the lower lamps 460 upward toward a substrate W.

The upper lamps 470 may be disposed on or above the top wall 404 of the chamber 410 and may heat a substrate W at a second temperature higher than the first temperature for a short time (millisecond level). In some embodiments, the second temperature may be about 1200° C. In other words, a substrate W may be heated from about 850° C. to about 1200° C. for a millisecond (e.g., about 0.001 second) by the upper light 472. Thus, dopants implanted in the substrate W may be activated but may not be deeply diffused. The upper lamps 470 may be the same kind as the lower lamps 460. In other words, each of the upper lamps 470 may include an arc lamp. The upper lamps 470 may have bar shapes and may be disposed parallel to each other. The upper lamps 470 may be provided in a plane parallel to a substrate W loaded on the support member 450. An upper reflective housing 474 may be provided above or on the upper lamps 470. The upper reflective housing 474 may reflect the upper light 472 of the upper lamps 470 downward toward a substrate W. In some embodiments, the number of the lower lamps 460 may be different than the number of the upper lamps 470. For example, the heating member may include two lower lamps 460 and four upper lamps 470. However, embodiments of the inventive concepts are not limited thereto. In certain embodiments, the number of the lower lamps 460 may be equal to the number of the upper lamps 470.

The support member 450 may be disposed in the central portion of the chamber 410 to divide the inner space of the chamber 410 into two spaces. In other words, the inner space of the chamber 410 may be divided into an upper space 408U and a lower space 408L by the support member 450. The upper space 408U may be defined as a space surrounded by the top wall 404, upper portions of the first to fourth side walls 406a to 406d, and the support member 450. The lower space 408L may be defined as a space surrounded by the bottom wall 402, lower portions of the first to fourth side walls 406a to 406d, and the support member 450. A substrate W may be provided in the upper space 408U of the chamber 410. Hereinafter, a portion of the chamber 410 including the upper space 408U may be defined as an upper chamber 410U, and another portion of the chamber 410 including the lower space 408L may be defined as a lower chamber 410L.

The support member 450 may include a base 420, a support plate 430, support pins 432, and an adjustment block 434. The base 420 may be provided on the side wall 406 of the chamber 410. For example, the base 420 may be disposed on side wall frames 409 laterally extending or protruding from the inner side surface of the side wall 406. Outer side surfaces of the base 420 may face the side wall 406 of the chamber 410. The side wall frames 409 may be formed at corners of the chamber 410. An adjacent two of the first to fourth side walls 406a to 406d may meet each other at each of the corners of the chamber 410. As illustrated in FIG. 3, the side wall frames 409 may have an L-shape when viewed from a plan view. The base 420 may have a flat plate shape having a through-hole 422 and a cut region 424. The through-hole 422 may be formed in or at a central portion of the base 420, and the cut region 424 may be formed in or at an edge or peripheral portion of the base 420. The through-hole 422 may be an open hole which completely penetrates the base 420. In some embodiments, the through-hole 422 may have a circular shape when viewed from a plan view. The base 420 may support the support plate 430 and may expose a bottom surface of the support plate 430. For example, the base 420 may have a mount portion 426 laterally extending protruding from an inner side surface of the through-hole 422 (e.g., surrounding the through-hole 422), and the support plate 430 may be disposed on the mount portion 426. The inner side surface of the through-hole 422, on which the mount portion 426 is formed, may have stepped shape, and the base 420 may surround an outer side surface of the support plate 430.

In some embodiments, the cut region 424 may have a groove or recess shape defined by the outer side surface of the base 420, which is recessed toward a central portion of the base 420. The cut region 424 may have a rectangular shape when viewed from a plan view. One side surface of the cut region 424 which is parallel to a long axis of the cut region 424 may be open. That is, the cut region 424 may extend to (or from) the edge or outer side surface of the base 420. The cut region 424 may have a length in a long axis direction thereof and a width in a short axis direction thereof. The cut region 424 may be provided in a plurality along edges of the base 420. In some embodiments, the plurality of cut regions 424 may include first, second, third and fourth cut regions 424_1, 424_2, 424_3 and 424_4 which are provided along the edges of the base 420. The first and third cut regions 424_1 and 424_3 may face each other (e.g., be disposed on opposite sides of the base 420), and the long axes of the first and third cut regions 424_1 and 424_3 may be parallel to each other. The second and fourth cut regions 424_2 and 424_4 may face each other (e.g., be disposed on opposite sides of the base 420), and the long axes of the second and fourth cut regions 424_2 and 424_4 may be parallel to each other. The long axes of the second and fourth cut regions 424_2 and 424_4 may be substantially perpendicular to the long axes of the first and third cut regions 424_1 and 424_3. Widths and lengths of the first to fourth cut regions 424_1, 424_2, 424_3 and 424_4 may be variously changed as necessary. For example, the widths of the first to fourth cut regions 424_1 to 424_4 may be equal to each other, but the length of the third cut region 424_3 may be greater than those of the first, second and fourth cut regions 424_1, 424_2 and 424_4. In some embodiments, the first to fourth cut regions 424_1 to 424_4 may face or be adjacent the first to fourth side walls 406a to 406d, respectively.

Since the base 420 has the cut region 424, a slit may be formed between the base 420 and the side wall 406 of the chamber 410. One or more slits may be provided according to the number of the cut regions 424. For example, four slits may be formed by the first to fourth cut regions 424_1 to 424_4 and the first to fourth side walls 406a to 406d. Widths and lengths of the slits may correspond to the widths and the lengths of the cut regions 424_1 to 424_4, respectively. In FIG. 3, the outer side surfaces of the base 420 may be in contact with the side walls 406a to 406d of the chamber 410. However, embodiments of the inventive concepts are not limited thereto. In certain embodiments, the outer side surfaces of the base 420 may be spaced apart from the side walls 406a to 406d of the chamber 410. In this case, the width of each of the slits may be greater than the width of a corresponding one of the cut regions 424_1 to 424_4. The base 420 may be formed of a metal (e.g., aluminum).

The support plate 430 may be disposed at a central portion of the base 420 and may receive a substrate W. The support plate 430 may have a circular shape when viewed from a plan view. An area of a top surface of the support plate 430 may be greater than an area of a substrate W. In some embodiments, the support plate 430 may be formed of a material capable of transmitting light. For example, the support plate 430 may be formed of quartz or a sapphire. The lower light 462 of the lower lamps 460 may be transmitted through the bottom wall 402 and the support plate 430 so as to be provided to a bottom surface of a substrate W.

The support pins 432 may be provided on the support plate 430 and may extend or protrude upward from the support plate 430. The support pins 432 may be installed to be fixed on the top surface of the support plate 430. Three or more support pins 432 may be provided to directly support a substrate W. A substrate W supported by the support pins 432 may be parallel to the support plate 430. The support pins 432 may be formed of the same material (e.g., quartz or sapphire) as the support plate 430.

The adjustment block 434 may be inserted in the cut region 424 so as to be coupled to the base 420. The adjustment block 434 may occupy a portion of the slit. Thus, the slit may be divided into two sub-slits by the adjustment block 434. The two sub-slits may be defined or referred to as vents 440. The upper space 408U and the lower space 408L of the chamber 410 may be connected to or communicate with each other through the vents 440. The adjustment block 434 may be provided to limit the width of the slit and to form the vents 440 having widths in a specific size range. In some embodiments, the width Ws of each of the vents 440 may range from 1.7 mm to 3.3 mm. If the width Ws of the vent 440 is smaller than 1.7 mm, the vent 440 may not provide a sufficient size of a path connecting the upper space 408U to the lower space 408L. If the width Ws of the vent 440 is greater than 3.3 mm, a gas in the lower space 408L may flow backward into the upper space 408L through the vent 440. In some embodiments, the adjustment block 434 may be provided in each of the first to fourth cut regions 424_1 to 424_4. However, embodiments of the inventive concepts are not limited thereto. In certain embodiments, the adjustment block 434 may not be provided in one or more of the first to fourth cut regions 424_1 to 424_4. The cut region 424 in which the adjustment block 434 is not provided may have the width ranging from 1.7 mm to 3.3 mm.

The adjustment block 434 coupled to the base 420 may be detachable from the base 420. The adjustment block 434 may be movable in a width direction of the vent 440. For example, the adjustment block 434 may include a body 436 having a bar shape and joint portions or ledges 438 protruding from opposite ends of the body 436. For example, the adjustment block 434 may have a T-shaped cross section. A joint protrusion may be formed on each of the joint portions 438, and guide grooves 428 in which the joint protrusions are inserted or received may be formed in the base 420. A pair of the guide grooves 428 may face each other in a long axis direction of the cut region 424 with the cut region 424 interposed therebetween. The body 436 of the adjustment block 434 may be inserted in the cut region 424, and the joint portions 438 of the adjustment block 434 may be coupled to the guide grooves 428. The guide grooves 428 may guide the movement of the adjustment block 434. The widths Ws of the vents 440 may be adjusted by the movement of the adjustment block 434. The adjustment block 434 may be formed of the same metal material (e.g., aluminum) as the base 420.

A gas supply port 480 may be provided in an upper portion of the side wall 406. The gas supply port 480 may be provided in a plurality. For example, the gas supply port 480 may include first, second, third and fourth gas supply ports 480_1, 480_2, 480_3 and 480_4. In some embodiments, the first and second gas supply ports 480_1 and 480_2 and the third and fourth gas supply ports 480_3 and 480_4 may be disposed to be symmetrical to each other. For example, the first and second gas supply ports 480_1 and 480_2 may be provided in the upper portion of the first side wall 406a, and the third and fourth gas supply ports 480_3 and 480_4 may be provided in the upper portion of the third side wall 406c. In more detail, the first and second gas supply ports 480_1 and 480_2 may be provided to be adjacent to upper corners of the first side wall 406a, respectively. Likewise, the third and fourth gas supply ports 480_3 and 480_4 may be provided to be adjacent to upper corners of the third side wall 406c, respectively. However, embodiments of the inventive concepts are not limited thereto. The number and/or positions of the gas supply port 480 may be variously changed as desired or necessary. Each of the first to fourth gas supply ports 480_1 to 480_4 may be connected to a gas supply pipe 482. The gas supply pipe 482 may be connected to a gas supply source, and a gas of the gas supply source may be provided into the upper space 408U of the chamber 410 (i.e., the upper chamber 410U) through the gas supply pipe 482 and the gas supply port 480. In some embodiments, the gas may be an inert gas such as a nitrogen gas. The nitrogen gas may be provided to prevent an undesired reaction (e.g., an oxidation reaction) from occurring in the inside of the chamber 410 during the annealing process.

An exhaust port 490 may be formed in a lower portion of the side wall 406. The exhaust port 490 may be provided in a plurality. In some embodiments, the number of the exhaust ports 490 may be equal to the number of the gas supply ports 480, and the exhaust ports 490 may be respectively disposed at positions corresponding to the gas supply ports 480 when viewed from a plan view. For example, four exhaust ports 490 each may be disposed to be adjacent to lower corners of the first and third side walls 406a and 406c, respectively. For example, two exhaust ports 490 may be provided in the lower portion of the first side wall 406a, and other two exhaust ports 490 may be provided in the lower portion of the third side wall 406c. An exhaust pipe 492 may be connected to each of the exhaust ports 490. An inert gas atmosphere may be formed in the upper and lower spaces 408U and 408L of the chamber 410 in the annealing process. For example, when a substrate W is loaded in the upper space 408U of the chamber 410, the nitrogen gas may be supplied into the upper space 408U through the gas supply pipe 482 and the gas supply port 480. The gas in the upper space 408U may be moved into the lower space 408L through the vents 440 and may be then exhausted to the outside of the chamber 410 through the exhaust port 490 and the exhaust pipe 492.

Meanwhile, an out gas may be generated from a substrate W by a high temperature during the annealing process. The out gas may react with the inner surface of the chamber 410 and/or a surface of the support plate 430 to contaminate the inside of the chamber 410. The nitrogen gas may smoothly exhaust the out gas to the outside of the chamber 410, thereby preventing the contamination of the chamber 410. Reflectivity of the inner side surface of the side wall 406, transmittances of the bottom and top walls 402 and 404, and/or a transmittance of the support plate 430 may be reduced if the inside of the chamber 410 is contaminated by the out gas. This may deteriorate an effect and/or efficiency of the annealing process. In other words, sufficient heat may not be transmitted to a substrate W. In addition, heat may not be uniformly provided to a substrate W, and thus desired activation of dopants may not be performed. Moreover, the out gas may react with the inner surface of the chamber 410 to generate a particle. As a result, a yield and characteristics of semiconductor devices formed on a substrate W may be deteriorated. Furthermore, performance of a substrate treating apparatus may be deteriorated by the contamination of the chamber 410, and thus a cleaning period of equipment may be shortened to reduce the working time of equipment. This may mean that productivity or throughput of semiconductor devices is reduced.

The substrate treating apparatus 400 according to some embodiments of the inventive concepts may provide various ways for preventing the contamination of the inside of the chamber 410. In some embodiments, the gas in the upper chamber 410U may be smoothly moved into the lower chamber 410L in the substrate treating apparatus 400 according to some embodiments of the inventive concepts. For example, as described above, since the plurality of vents 440 having the widths in the specific range are used as the path connecting the upper and lower chambers 410U and 410L to each other, it is possible to provide the path having the sufficient size capable of smoothly moving the gas from the upper chamber 410U into the lower chamber 410L while preventing the backward flow of the gas from the lower chamber 410L to the upper chamber 410U. If a single vent is used as a path connecting the upper and lower chambers 410U and 410L, a width of the single vent may be limited to a predetermined width (e.g., 3.3 mm) or less for preventing a backward flow of a gas, and thus, it may be difficult to provide a path having a sufficient size for a smooth gas flow.

Hereinafter, configurations for adjusting a flow of a gas in the upper chamber 410U will be described as well as configurations for smoothly moving the gas from the upper chamber 410U into the lower chamber 410L.

Figure 6A:
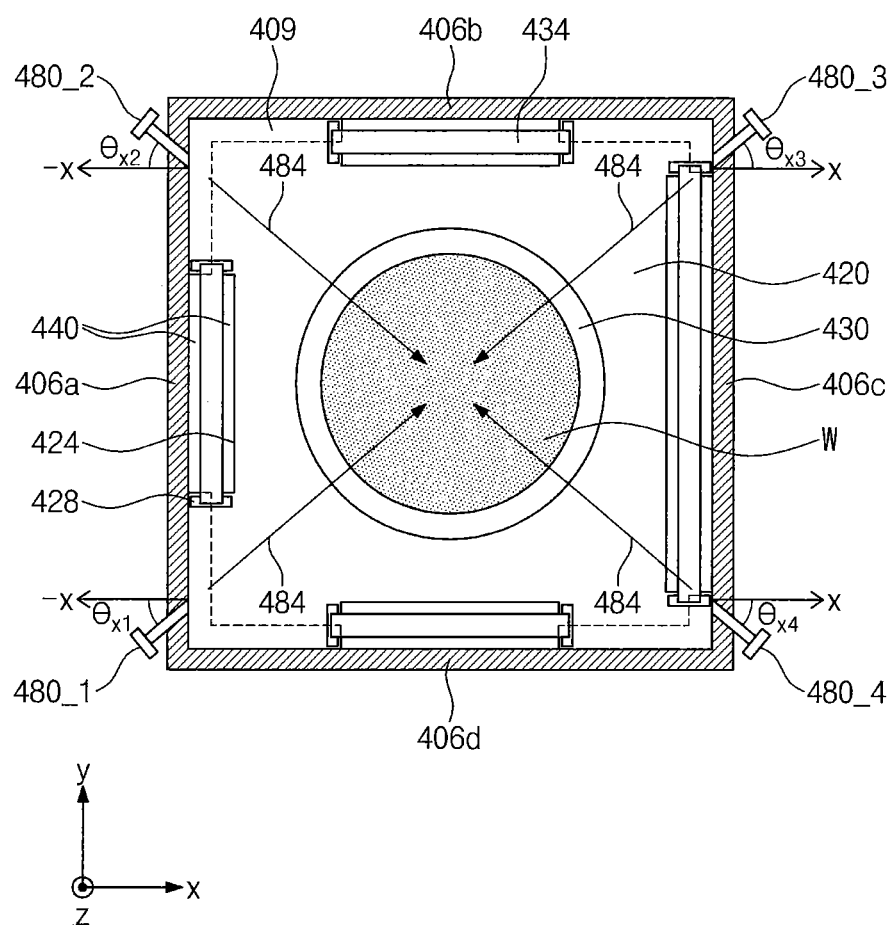
FIGS. 6A and 6B are a plan view and a cross-sectional view of a portion of the apparatus of FIG. 2, respectively, to illustrate the arrangement of gas supply ports according to some embodiments of the inventive concepts.
Figure 6B:
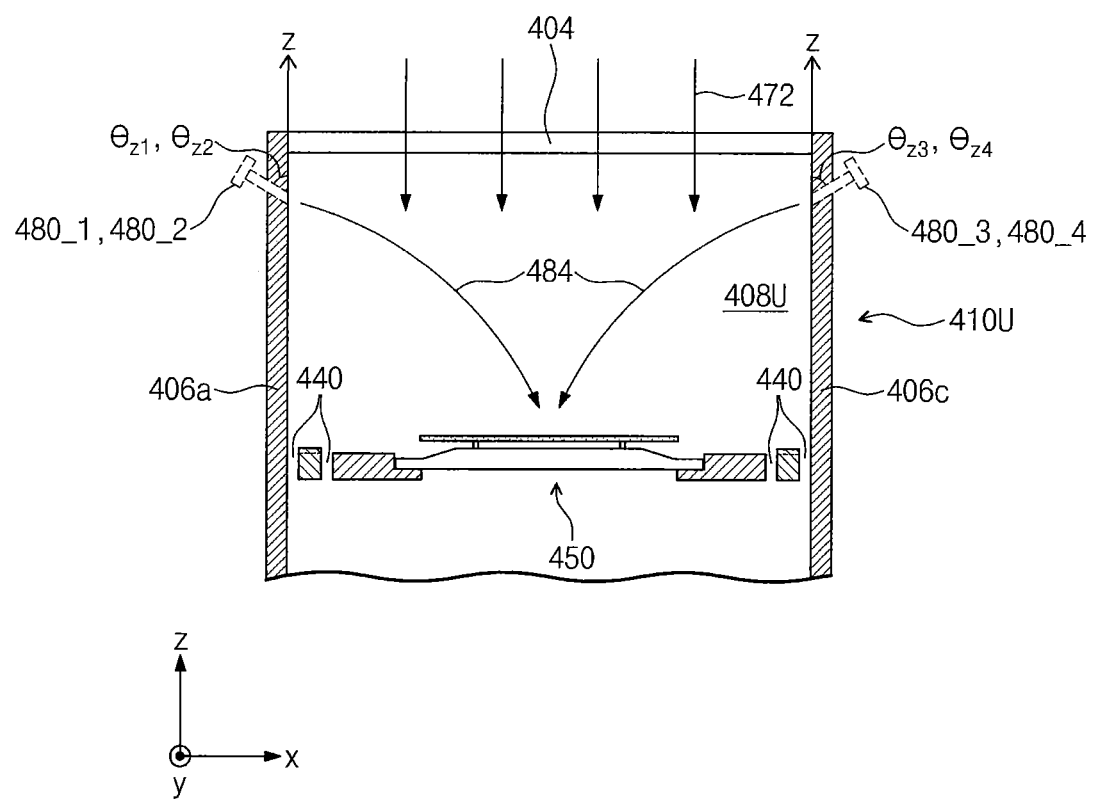
Figure 7A:
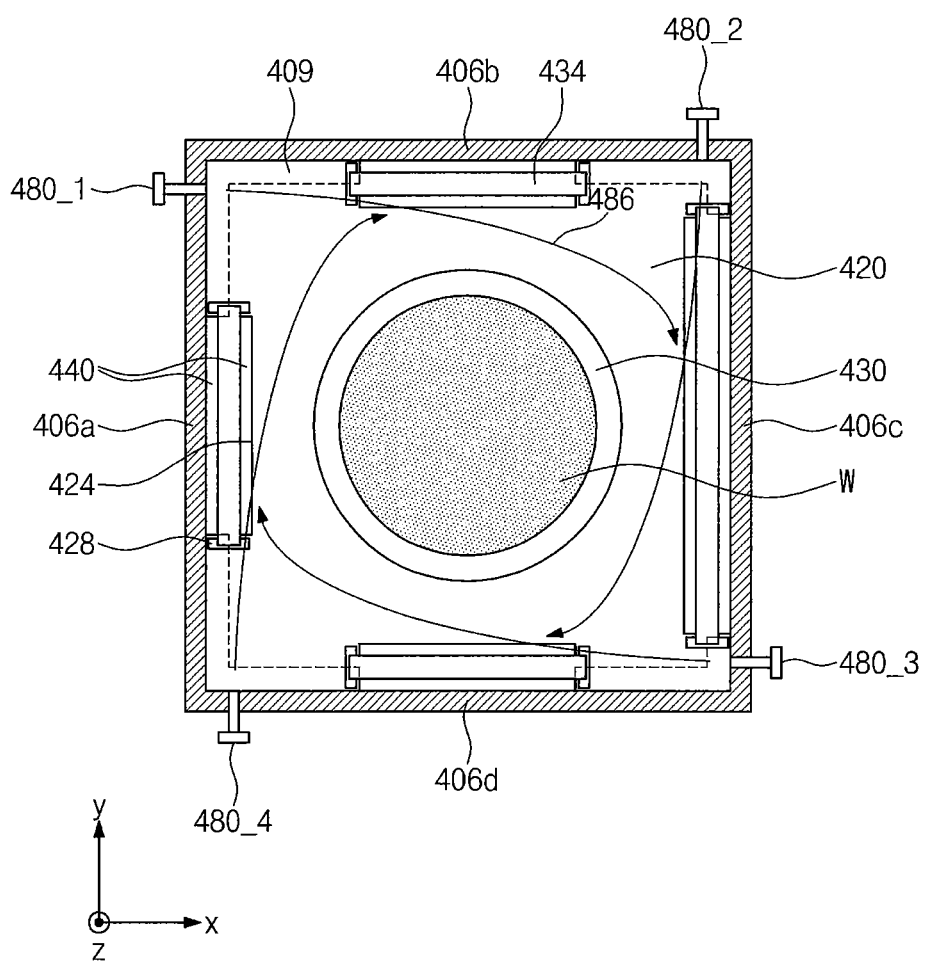
FIGS. 7A and 7B are a plan view and a cross-sectional view of a portion of the apparatus of FIG. 2, respectively, to illustrate the arrangement of gas supply ports according to some embodiments of the inventive concepts.
Figure 7B:
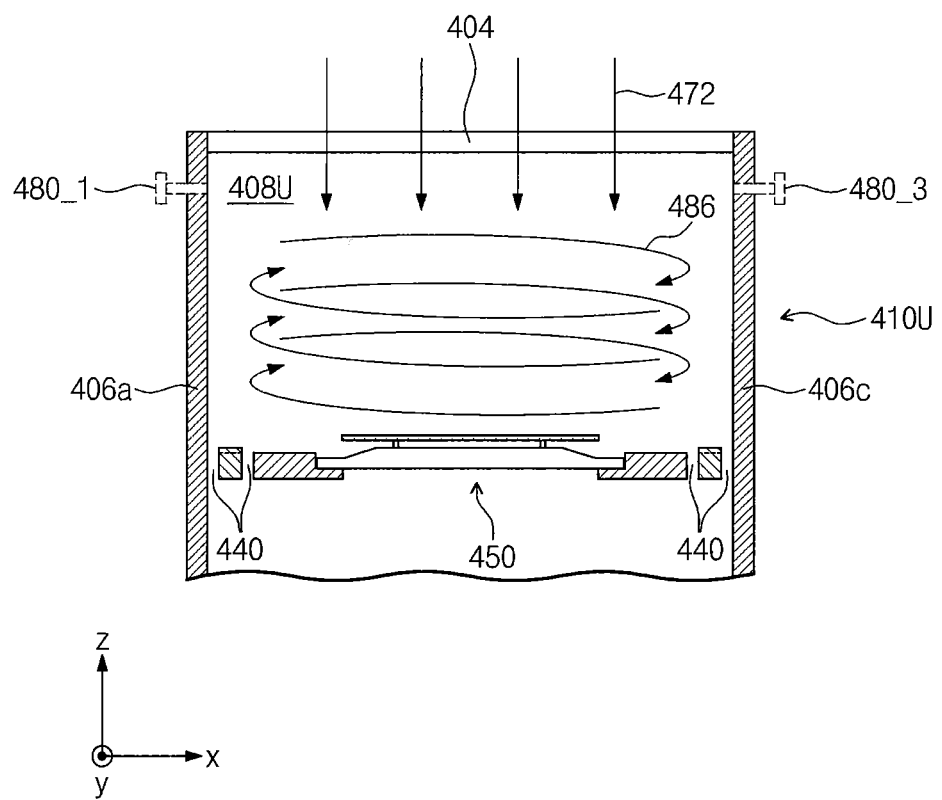

FIGS. 6A and 6B are a plan view and a cross-sectional view of a portion of the apparatus of FIG. 2, respectively, to illustrate the arrangement of gas supply ports according to some embodiments of the inventive concepts. FIGS. 7A and 7B are a plan view and a cross-sectional view of a portion of the apparatus of FIG. 2, respectively, to illustrate the arrangement of gas supply ports according to some embodiments of the inventive concepts.

Referring to FIGS. 6A and 6B, the first and second gas supply ports 480_1 and 480_2 may be provided to be adjacent the upper corners of the first side wall 406a, respectively, and the third and fourth gas supply ports 480_3 and 480_4 may be provided to adjacent the upper corners of the third side wall 406c, respectively. Here, the first to fourth gas supply ports 480_1 to 480_4 may be provided to form a strong descending gas current 484 using the nitrogen gas supplied therefrom in a central region of the upper chamber 410U. As illustrated in FIG. 6A, each of the first to fourth gas supply ports 480_1 to 480_2 may make or have a tilt angle with an x direction or −x direction to face or be directed toward the central region of the upper chamber 410U when viewed from a plan view. In addition, as illustrated in FIG. 6B, each of the first to fourth gas supply ports 480_1 to 480_2 may make or have a tilt angle with a z direction to face or be directed toward a lower region of the upper chamber 410U when viewed from a cross-sectional view. In other words, the first gas supply port 480_1 may be tilted toward a center of the upper space 408U so as to be parallel to or directed in a first direction, and the second gas supply port 480_2 may be tilted toward the center of the upper space 408U so as to be parallel to or directed in a second direction. Likewise, the third gas supply port 480_3 may be tilted toward the center of the upper space 408U so as to be parallel to or directed in a third direction, and the fourth gas supply port 480_4 may be tilted toward the center of the upper space 408U so as to be parallel to or directed in a fourth direction. Here, the first direction may be tilted at an angle $\theta_{x1}$ from the −x direction and may be tilted at an angle $\theta_{z1}$ from the z direction. The second direction may be tilted at an angle $\theta_{x2}$ from the −x direction and may be tilted at an angle $\theta_{z2}$ from the z direction. The third direction may be tilted at an angle $\theta_{x3}$ from the x direction and may be tilted at an angle $\theta_{z3}$ from the z direction. The fourth direction may be tilted at an angle $\theta_{x4}$ from the x direction and may be tilted at an angle $\theta_{z4}$ from the z direction. Meanwhile, the x and −x directions may be defined as a direction in which the second and fourth side walls 406b and 406d are arranged, and y and −y directions may be defined as a direction in which the first and third side walls 406a and 406c are arranged. The z and −z directions may be perpendicular to the x and y directions. In other words, the x and −x directions may be defined as a width (or thickness) direction of the first and third side walls 406a and 406c, and the y and −y directions may be defined as a length direction of the first and third side walls 406a and 406c. In addition, the z and −z directions may be defined as a height direction of the first and third side walls 406a and 406c. The aforementioned angles $\theta_{x1}$, $\theta_{z1}$, $\theta_{x2}$, $\theta_{z2}$, $\theta_{x3}$, $\theta_{z3}$, $\theta_{x4}$, and $\theta_{z4}$ may be varied as necessary.

When the nitrogen gas is supplied from the first to fourth gas supply ports 480_1 to 480_4 in the annealing process, the nitrogen gas in the upper chamber 410U may form the strong descending gas current 484 in the central region of the upper chamber 410 and may then be moved along a top surface of a substrate W toward the vents 440. Thereafter, the nitrogen gas may be moved into the lower chamber 410L through the vents 440. Thus, it is possible to prevent the out gas from reaching the first to fourth side walls 406a to 406d and the top wall 404 of the upper chamber 410U. As a result, contamination of the upper chamber 410U may be minimized or prevented. In addition, it is possible to remove particles falling from the upper chamber 410U. To form the strong descending gas current 484, the nitrogen gas may be supplied at a flow rate of 1700 sccm to 3500 sccm.

Referring to FIGS. 7A and 7B, the first to fourth gas supply ports 480_1 to 480_4 may be provided in the upper portions of the first to fourth side walls 406a to 406d, respectively, and may be arranged at 90 degrees intervals. For example, the first gas supply port 480_1 may be formed to be adjacent an upper corner of the first side wall 406a. The second gas supply port 480_2 may be formed to be adjacent to an upper corner of the second side wall 406b, which is relatively far away from the first gas supply port 480_1. The third gas supply port 480_3 may be formed to be adjacent to an upper corner of the third side wall 406c, which is relatively far away from the second gas supply port 480_2. The fourth gas supply port 480_4 may be formed to be adjacent to an upper corner of the fourth side wall 406d, which is relatively far away from the third gas supply port 480_3. The first to fourth gas supply ports 480_1 to 480_4 may be provided in or parallel to an xy plane. When the nitrogen gas is supplied from the first to fourth gas supply ports 480_1 to 480_4 in the annealing process, a spiral gas current 486 may be formed along the inner side surfaces of the upper chamber 410U. Thus, it is possible to prevent the out gas from reaching the first to fourth side walls 406a to 406d and the top wall 404 of the upper chamber 410U. As a result, contamination of the upper chamber 410U may be minimized or prevented. The nitrogen gas may be supplied at a flow rate of 1700 sccm to 3500 sccm.

Figure 8A:
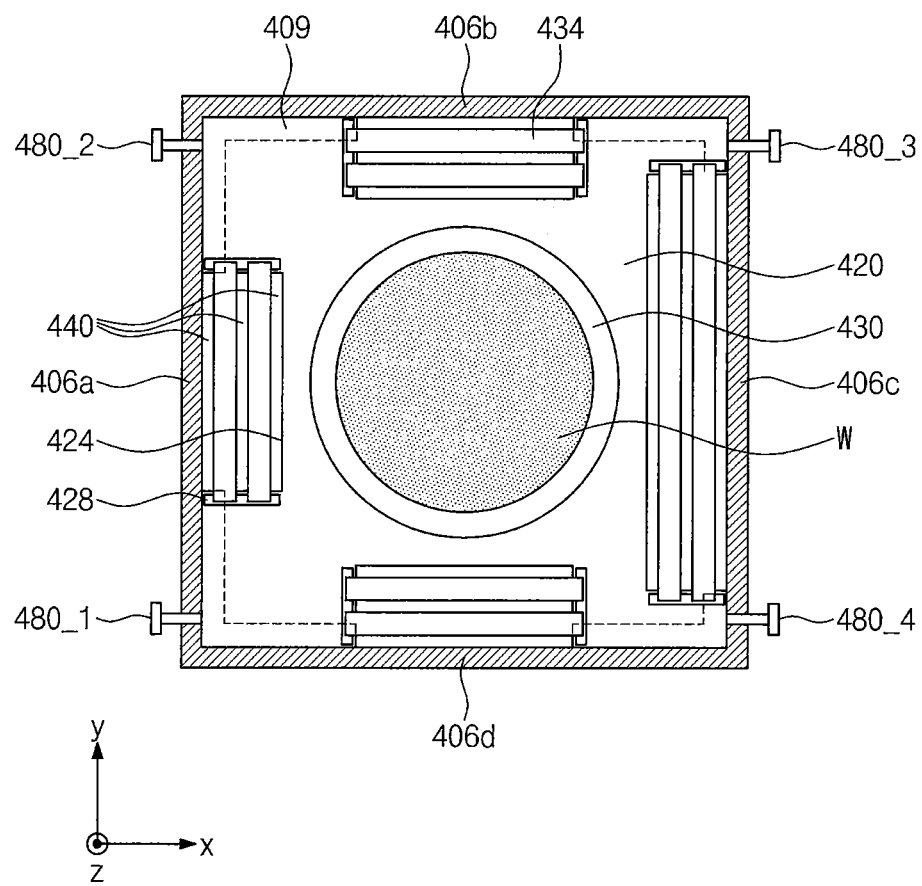
FIG. 8A is a plan view corresponding to a portion of the apparatus of FIG. 2 to illustrate a support member according to some embodiments of the inventive concepts.
Figure 8B:
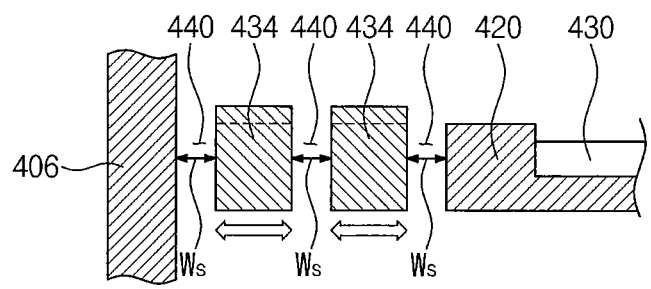
FIG. 8B is an enlarged cross-sectional view illustrating a portion of the support member of FIG. 8A.

FIG. 8A is a plan view corresponding to a portion of the apparatus of FIG. 2 to illustrate a support member according to some embodiments of the inventive concepts. FIG. 8B is an enlarged cross-sectional view illustrating a portion of the support member of FIG. 8A. For the purpose of ease and convenience in explanation, differences between a support member of the present embodiment, and the support member of the aforementioned embodiments will be primarily described hereinafter.

Referring to FIGS. 8A and 8B, a plurality of adjustment blocks 434 may be provided in the cut region 424 of the base 420. For example, two adjustment blocks 434 may be provided in each of the first to fourth cut regions 424_1 to 424_4. Thus, three vents 440 may be formed between the side wall 406 and the inner side surface of each of the cut regions 424_1 to 424_4. A width Ws of each of the vents 440 may range from 1.7 mm to 3.3 mm. In some embodiments, the adjustment blocks 434 may have the same width. However, embodiments of the inventive concepts are not limited thereto. In certain embodiments, the widths of the adjustment blocks 434 may be different from each other as desired or necessary. Each of the cut regions 424_1 to 424_4 may have a sufficient width such that each of the cut regions 424_1 to 424_4 may receive the plurality of adjustment blocks 434. The adjustment blocks 434 may be coupled to the base 420 and may be detachable from the base 420. The adjustment blocks 434 may be linearly movable in the width direction of the cut region 424. In some embodiments, the adjustment blocks 434 may be moved to be in contact with each other or at least one of the adjustment blocks 434 may be moved to be in contact with the side wall 406 or the base 420. Thus, the number and/or the widths of the vents 440 may be adjusted in the cut region 424. Other elements of the support member according to the present embodiment may be the same or similar as corresponding elements of the support member described with reference to FIGS. 2 to 5. In addition, the technical features of the embodiments described with reference to FIGS. 6A, 6B, 7A, and 7B may also be applied to the substrate treating apparatus according to the present embodiment.

Figure 9A:
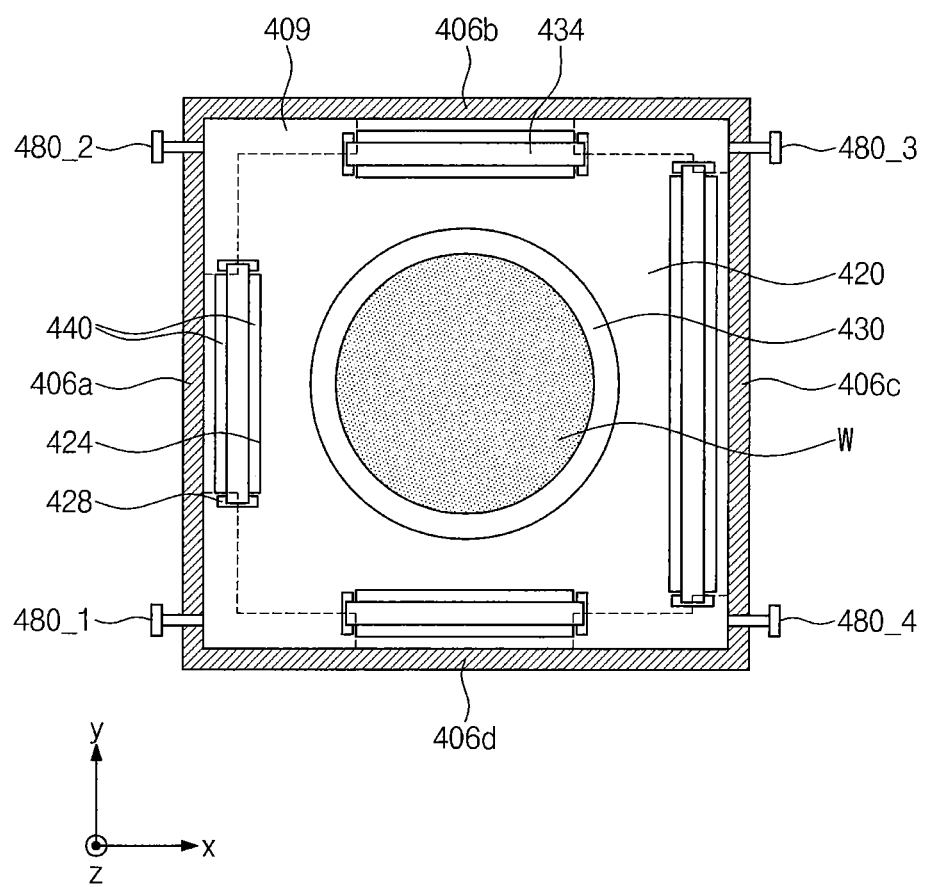
FIG. 9A is a plan view corresponding to a portion of the apparatus of FIG. 2 to illustrate a support member according to some embodiments of the inventive concepts.
Figure 9B:
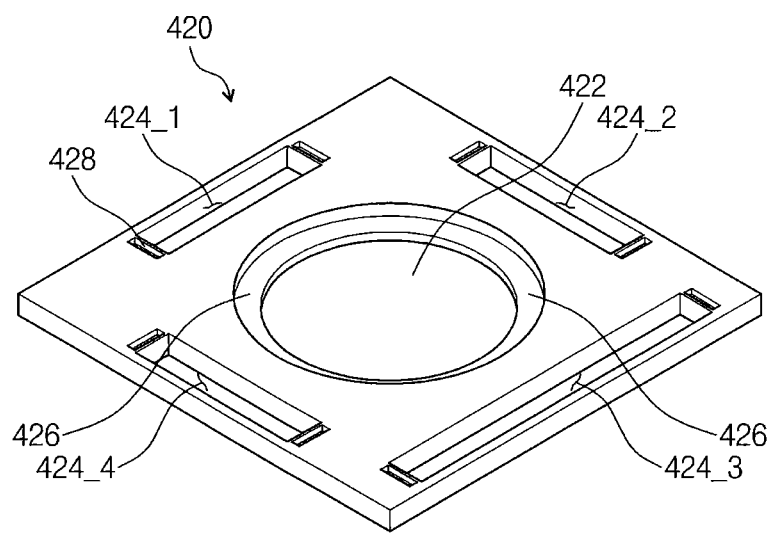
FIG. 9B is a perspective view illustrating a base of FIG. 9A.

FIG. 9A is a plan view corresponding to a portion of the apparatus of FIG. 2 to illustrate a support member according to some embodiments of the inventive concepts. FIG. 9B is a perspective view illustrating a base of FIG. 9A. For the purpose of ease and convenience in explanation, differences between a support member of the present embodiment and the support member of the aforementioned embodiments will be primarily described hereinafter.

Referring to FIGS. 9A and 9B, the base 420 may include a cut region 424 which is formed to be adjacent an edge of the base 420. In the present embodiment, the cut region 424 may have an open hole or slit shape completely penetrating the base 420. In other words, the cut region 424 may have a rectangular shape of which all side surfaces are closed. That is, the cut region 424 may not extend to (or from) an edge or outer side surface of the base 420. Thus, the cut region 424 may form the slit described with reference to FIGS. 2 to 5. The adjustment block 434 may be provided in the cut region 424 to form the vents 440. Even though not shown in the drawings, as described with reference to FIGS. 8A and 8B, a plurality of adjustment blocks 434 may be provided in the cut region 424. Other elements of the support member according to the present embodiment may be the same or similar as corresponding elements of the support member described with reference to FIGS. 2 to 5. In addition, the technical features of the embodiments described with reference to FIGS. 6A, 6B, 7A, and 7B may also be applied to the substrate treating apparatus according to the present embodiment.

Figure 10:
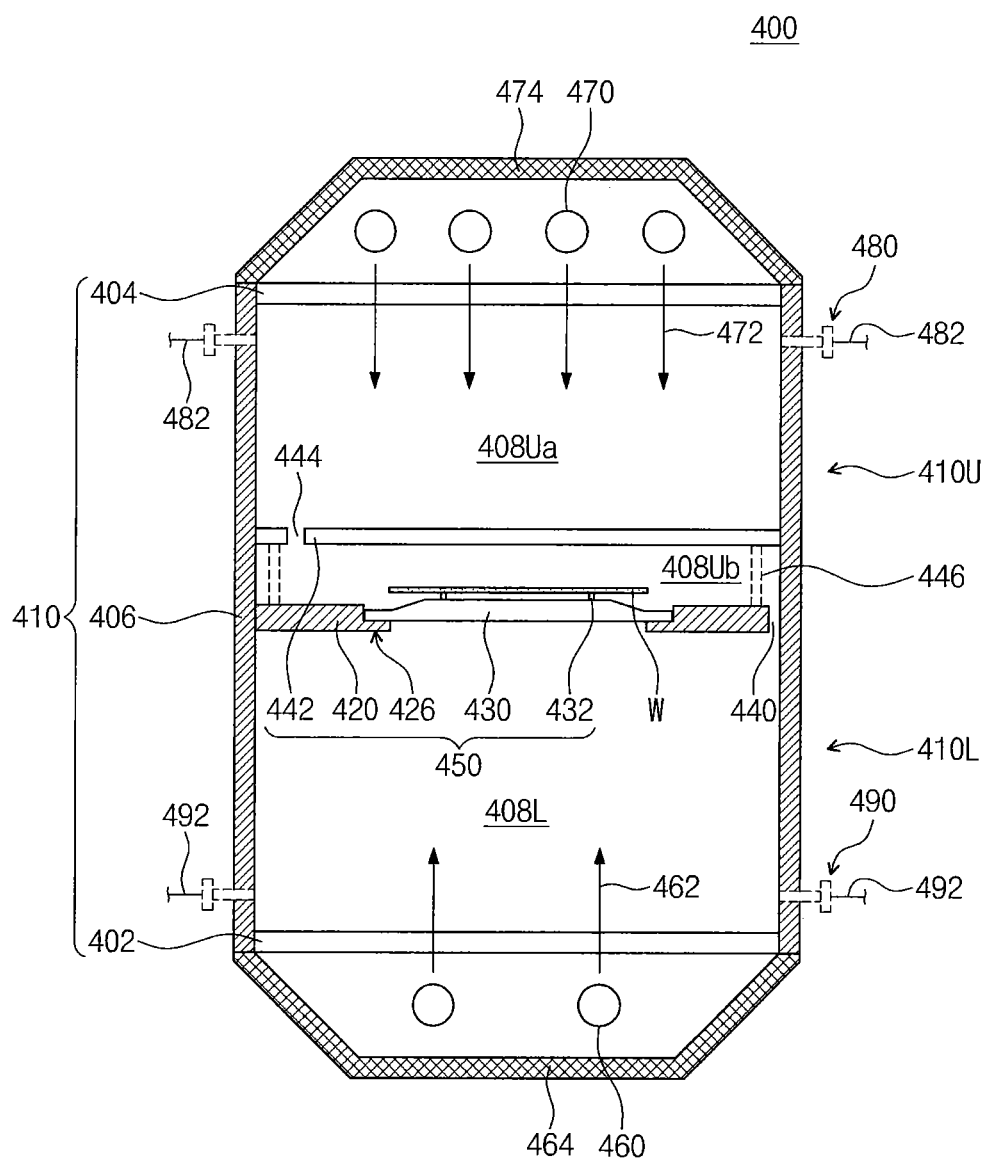
FIG. 10 is a cross-sectional view schematically illustrating an apparatus for treating a substrate, according to some embodiments of the inventive concepts.
Figure 11:
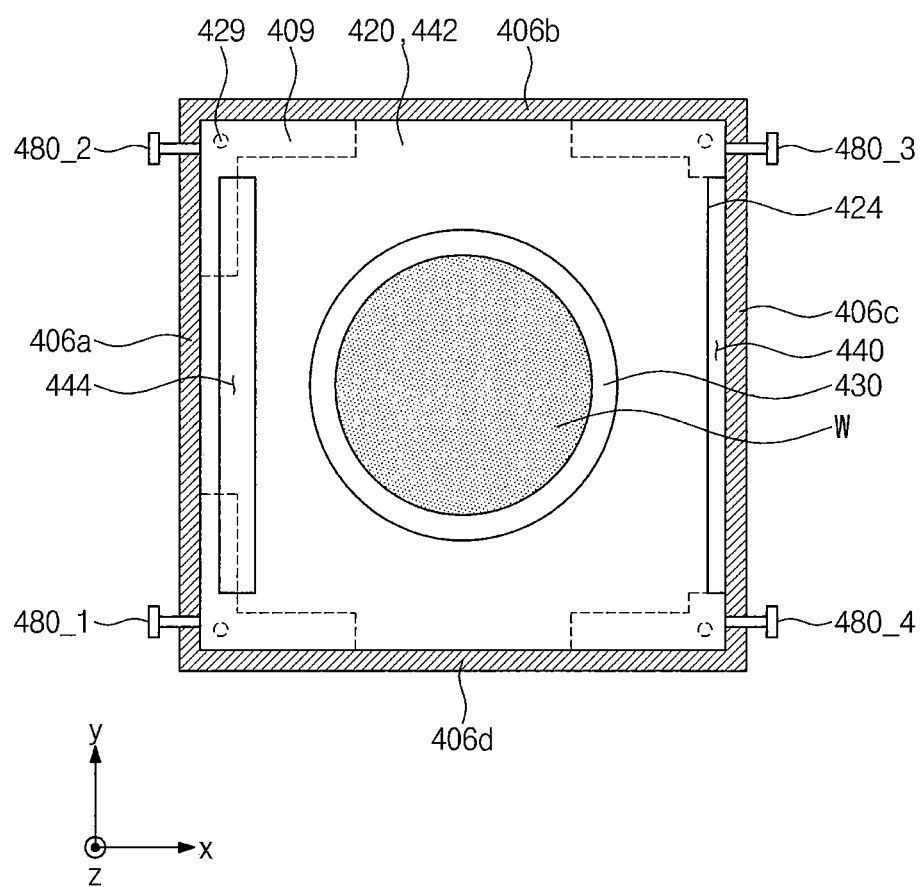
FIG. 11 is a plan view illustrating a portion of the apparatus of FIG. 10.
Figure 12:
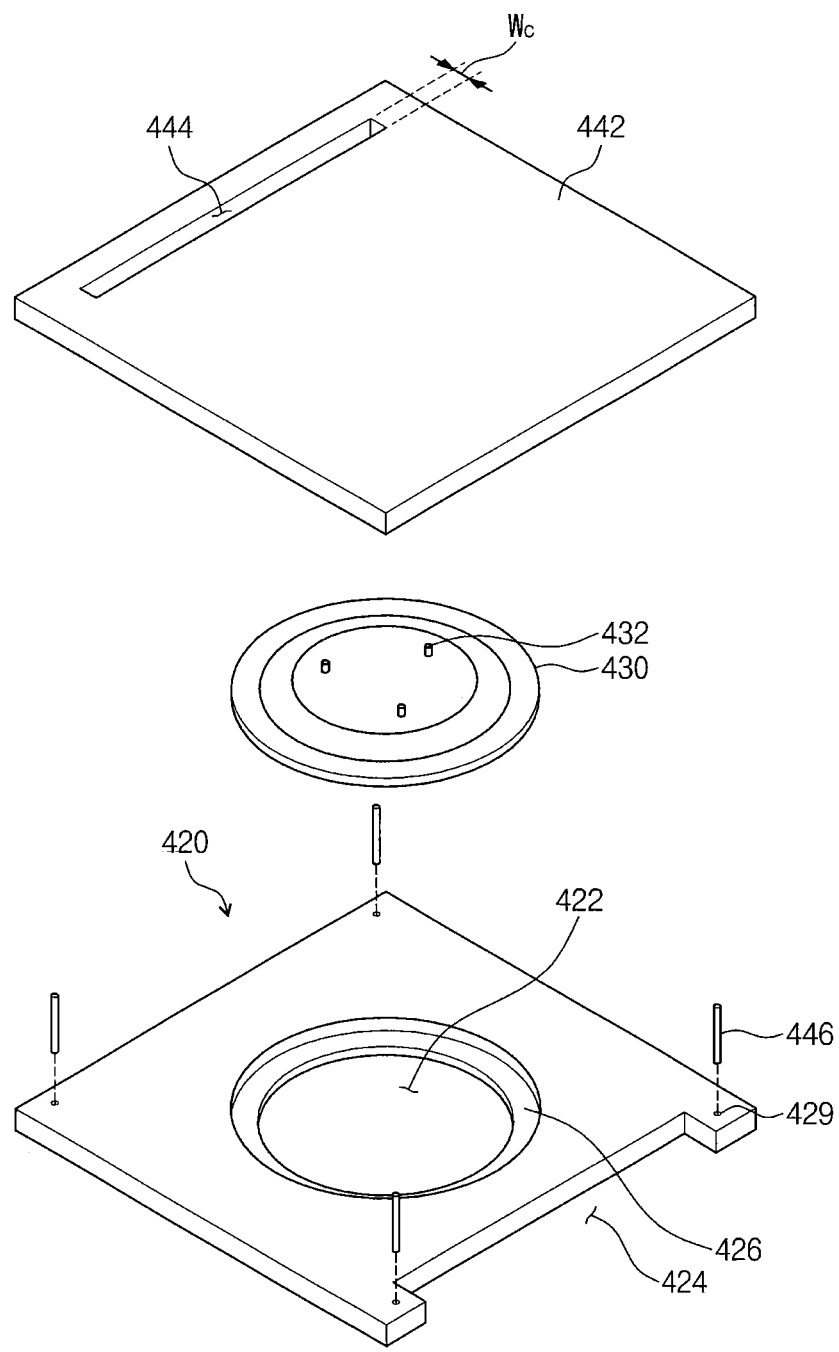
FIG. 12 is an exploded perspective view illustrating a support member of FIG. 10.
Figure 13:
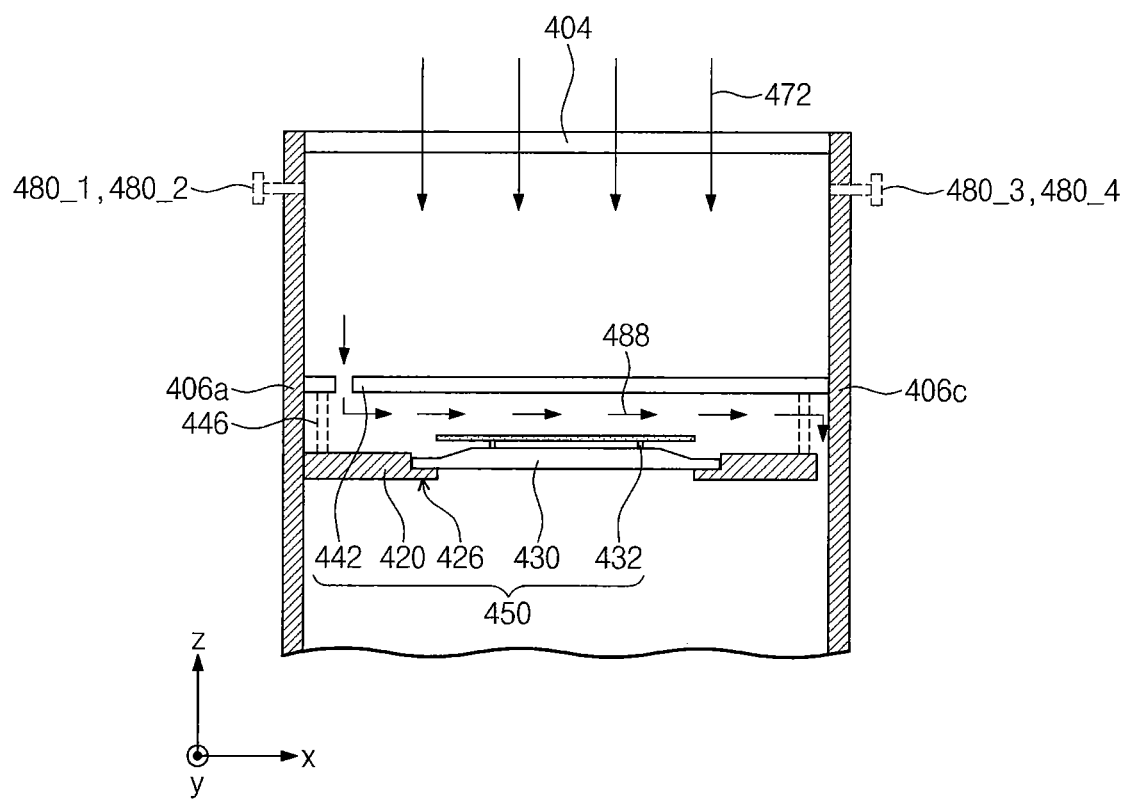
FIG. 13 is a cross-sectional view illustrating a portion of the apparatus of FIG. 10.
Figure 14:
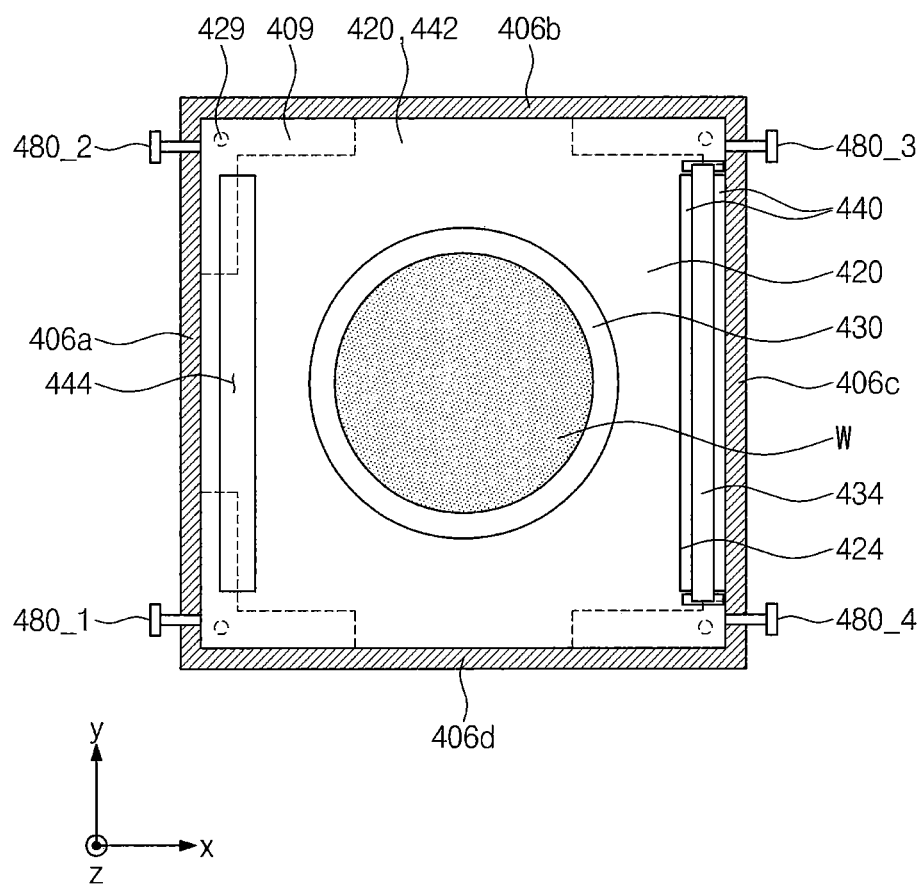
FIGS. 14 and 15 are plan views illustrating portions of apparatuses for treating a substrate, according to some embodiments of the inventive concepts.
Figure 15:
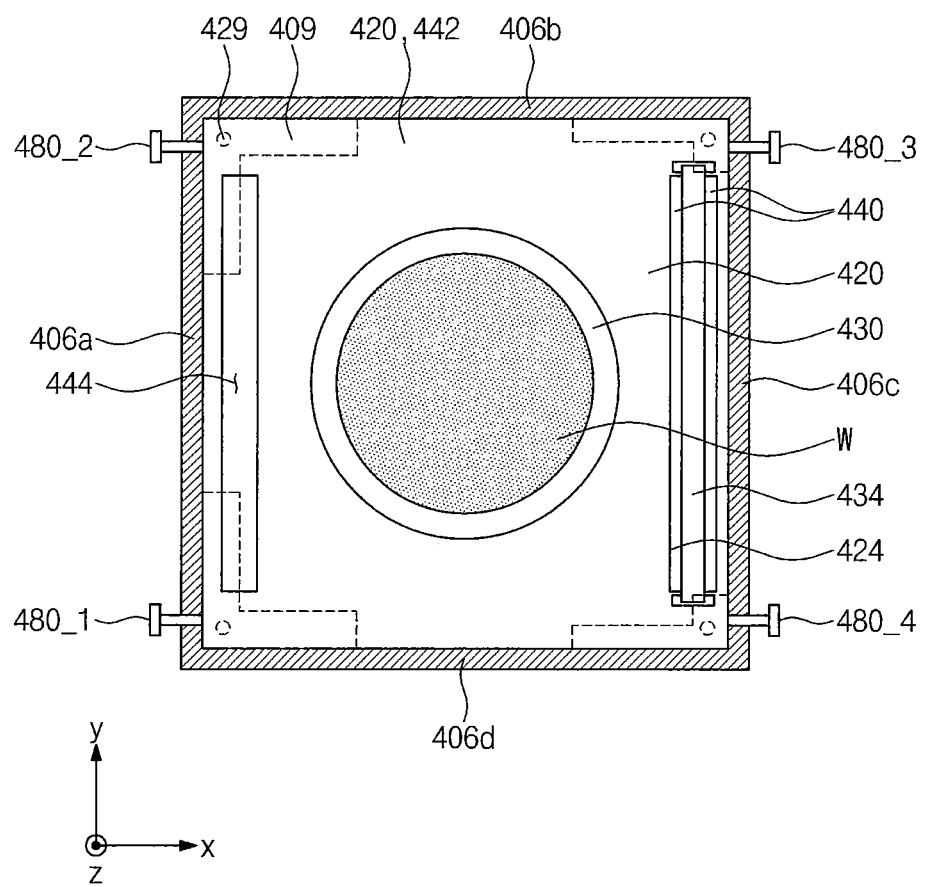

FIG. 10 is a cross-sectional view schematically illustrating an apparatus for treating a substrate, according to some embodiments of the inventive concepts. FIGS. 11 and 13 are a plan view and a cross-sectional view illustrating a portion of the apparatus of FIG. 10, respectively. FIG. 12 is an exploded perspective view illustrating a support member of FIG. 10. FIGS. 14 and 15 are plan views illustrating portions of apparatuses for treating a substrate, according to some embodiments of the inventive concepts.

Referring to FIGS. 10 to 13, a substrate treating apparatus 400 may include a chamber 410, a support member 450, and a heating member. The chamber 410 and the heating member may be the same or similar as described with reference to FIGS. 2 to 5, and thus, the detailed descriptions thereof will be omitted below in the interest of brevity.

The support member 450 may include a base 420, a support plate 430, support pins 432, and a blocking plate 442. The base 420 may have a flat plate shape having a through-hole 422 formed in its central portion and a cut region 424 formed in its edge portion. In some embodiments, the cut region 424 may have a groove shape defined by the outer side surface of the base 420 recessed toward the central portion of the base 420. The cut region 424 may have a rectangular shape when viewed from a plan view, and one side surface of the cut region 424 parallel to the long axis of the cut region 424 may be open. The cut region 424 may have a length in a long axis direction thereof and a width in a short axis direction thereof. In the present embodiment, the base 420 may have one cut region 424. The cut region 424 and the side wall 406 of the chamber 410 may define or form the slit. In the present embodiment, the slit may be defined as a vent 440. A width and a length of the vent 440 may correspond to the width and length of the cut region 424, respectively. In FIG. 11, the outer side surfaces of the base 420 may be in contact with the side walls 406a to 406d of the chamber 410. Alternatively, the outer side surfaces of the base 420 may be spaced apart from the side walls 406a to 406d of the chamber 410. In this case, the width of the vent 440 may be greater than the width of the cut region 424. The width of the vent 440 may range from 1.7 mm to 3.3 mm. The support plate 430 may be disposed on the mount portion 426 laterally protruding from the inner side surface of the through-hole 422. The support pins 432 may be provided on the top surface of the support plate 430 so as to directly support a substrate W.

The support member 450 not including the adjustment block 434 is illustrated in the present embodiment. However, embodiments of the inventive concepts are not limited thereto. In certain embodiments, the support member 450 according to the present embodiment may further include the adjustment block 434. In other words, as illustrated in FIG. 14, the adjustment block 434 may be inserted in the cut region 424 of the base 420 to form two vents 440. The cut region 424 may have a sufficient width such that the cut region 424 receives the adjustment block 434. The width of each of the two vents 440 may range from 1.7 mm to 3.3 mm. Even though not shown in FIG. 14, a plurality of adjustment blocks 434 may be provided in the cut region 424. In certain embodiments, as illustrated in FIG. 15, the cut region 424 may have an open hole shape completely penetrating the base 420. In other words, the cut region 424 may have a rectangular shape of which all side surfaces are closed. In addition, the adjustment block 434 may be formed or inserted in the cut region 424 of the base 420 to form two vents 440.

Referring again to FIGS. 10 to 13, the blocking plate 442 may be disposed on the base 420 to cover the support plate 430. For example, the base 420 may have support holes 429, and support rods 446 may be inserted in the support holes 429. The support holes 429 may be formed to be adjacent corners of the base 420. The blocking plate 442 may be disposed on the support rods 446 and may be supported by the support rods 446. Outer side surfaces of the blocking plate 442 may be in contact with the first to fourth side walls 406a to 406d. The upper space 408U of the chamber 410 may be divided into a first upper space 408Ua and a second upper space 408Ub by the blocking plate 442.

The blocking plate 442 may have a quadrilateral shape and may include a connection or communication hole 444 formed adjacent an edge portion of the blocking plate 442. The connection hole 444 may penetrate the blocking plate 442. The connection hole 444 may have a slit shape. In other words, the connection hole 444 may have a length in a long axis direction thereof and a width in a short axis direction thereof. The long axis of the connection hole 444 may be parallel to the outer side surface of the blocking plate 442 adjacent the connection hole 444. The width We of the connection hole 444 may range from 1.7 mm to 3.3 mm. The blocking plate 442 may be formed of a material capable of transmitting light. For example, the blocking plate 442 may be formed of quartz or a sapphire. The first upper space 408Ua and the second upper space 408Ub may be connected to or communicate with each other through the connection hole 444. According to some embodiments of the inventive concepts, the blocking plate 442 may be disposed such that the connection hole 444 is disposed at a position opposite to the position of the vent 440 when viewed from a plan view. For example, the cut region 424 of the base 420 may be adjacent the third side wall 406c, and the connection hole 444 of the blocking plate 442 may be adjacent the first side wall 406a opposite to the third side wall 406c. The gas supply ports 480_1 to 480_4 may supply the gas into the upper space 408Ua.

According to the present embodiment, the out gas generated in the annealing process may be blocked by the blocking plate 442 so as to be confined in the second upper space 408Ub. Thus, the first upper space 408Ua may be protected from the out gas. In addition, the single connection hole 444 and the single vent 440 may be provided to be opposite to each other when viewed from a plan view, and thus, the gas flowing into the second upper space 408Ub from the first upper space 408Ua through the connection hole 444 may form a gas current 488 of FIG. 13 that is fast flowing on a substrate W toward the vent 440. The out gas generated from a substrate W may pass through the vent 440 along the gas current 488 and may be then exhausted into the lower chamber 410L. As a result, it is possible to minimize contamination of the upper chamber 410U which may be caused by the out gas.

According to some embodiments of the inventive concepts, the substrate treating apparatus may provide various ways for preventing the inside of the chamber from being contaminated by the out gas generated in the annealing process. In some embodiments, the substrate treating apparatus may include the vents which have the widths in the specific range and are used as the path connecting the upper chamber to the lower chamber. In addition, the gas supply ports formed at the upper chamber may be disposed in various ways to form the gas current for smoothly moving the gas of the upper chamber into the lower chamber. In some embodiments, the substrate treating apparatus may include the blocking plate which blocks the out gas generated in the annealing process and rapidly exhausts the out gas into the lower chamber. As a result, during the annealing process, the out gas generated in the upper chamber may be smoothly moved into the lower chamber to prevent inner contamination of the chamber.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An apparatus for treating a substrate, the apparatus comprising:
   a chamber including a space in which a substrate is treated;
   a support member disposed in the chamber, the support member supporting the substrate;
   a heating member configured to heat the substrate; and
   a plurality of adjustment blocks,
   wherein the space is divided into an upper space and a lower space by the support member,
   wherein the support member comprises:
   a support plate receiving the substrate;
   a base supporting the support plate and exposing a bottom surface of the support plate, the base comprising a cut region formed in an edge portion of the base; and
   an adjustment block held in the cut region and coupled to the base,
   wherein the cut region fluidly connects the upper space to the lower space,
   wherein the adjustment block divides the cut region into a plurality of vents,
   wherein the cut region has a groove shape defined by an outer side surface of the base that is laterally recessed toward a central portion of the base,
   wherein the chamber comprises a top wall, a bottom wall, and a side wall between the top wall and the bottom wall,
   wherein the base is on the side wall such that a slit is defined by the cut region and the side wall,
   wherein the side wall includes first to fourth side walls, an open top end and an open bottom end,
   wherein the cut region is a first cut region,
   wherein the slit is a first slit that is defined by the first cut region and the first side wall,
   wherein the base further comprises second to fourth cut regions,
   wherein second to fourth slits are defined by the second to fourth side walls and the second to fourth cut regions, respectively,
   wherein at least one of the adjustment blocks is held in each of the first to fourth cut regions,
   the first slit is defined by the first cut region between the first side wall and the adjustment block held in the first cut region,
   the second slit is defined by the second cut region between the second side wall and the adjustment block held in the second cut region,
   the third slit is defined by the third cut region between the third side wall and the adjustment block held in the third cut region, and
   the fourth slit is defined by the fourth cut region between the fourth side wall and the adjustment block held in the fourth cut region.

2. An apparatus for treating a substrate, the apparatus comprising:
   a chamber including a space in which a substrate is treated;
   a support member disposed in the chamber, the support member supporting the substrate; and
   a heating member configured to heat the substrate,
   wherein the space is divided into an upper space and a lower space by the support member,
   wherein the support member comprises:
   a support plate receiving the substrate;
   a base supporting the support plate and exposing a bottom surface of the support plate, the base comprising a cut region formed in an edge portion of the base; and
   an adjustment block held in the cut region and coupled to the base,
   wherein the cut region fluidly connects the upper space to the lower space,
   wherein the adjustment block divides the cut region into a plurality of vents,
   wherein the support member further comprises: a blocking plate disposed on the base to divide the upper space into a first upper space and a second upper space,
   wherein the blocking plate includes a connection hole adjacent one edge of the blocking plate, and wherein the first upper space and the second upper space are fluidly connected to each other through the connection hole.

3. The apparatus of claim 2, wherein the connection hole has a rectangular shape extending along the one edge of the blocking plate.

4. The apparatus of claim 3, wherein a width of the connection hole ranges from 1.7 mm to 3.3 mm.

5. The apparatus of claim 2, wherein the chamber comprises first to fourth side walls, an open top end and an open bottom end,
   wherein the first and third side walls are opposite from each other,
   wherein the second and fourth side walls are opposite from each other and are substantially perpendicular to the first and third side walls,
   wherein the plurality of vents are adjacent the first side wall, and
   wherein the connection hole of the blocking plate is adjacent the third side wall.

6. The apparatus of claim 2, wherein the blocking plate is formed of a material configured to transmit light that is provided from the heating member.

7. An apparatus for treating a substrate, the apparatus comprising:
   a chamber including a space in which a substrate is treated;
   a support member disposed in the chamber, the support member supporting the substrate; and
   a heating member configured to heat the substrate,
   wherein the space is divided into an upper space and a lower space by the support member,
   wherein the support member comprises:
   a support plate receiving the substrate;
   a base supporting the support plate and exposing a bottom surface of the support plate, the base comprising a cut region formed in an edge portion of the base; and
   an adjustment block held in the cut region and coupled to the base,
   wherein the cut region fluidly connects the upper space to the lower space,
   wherein the adjustment block divides the cut region into a plurality of vents,
   wherein a portion of the chamber defining the upper space is an upper chamber,
   wherein another portion of the chamber defining the lower space is a lower chamber,
   wherein the apparatus is configured to move a gas provided in the upper chamber into the lower chamber through the plurality of vents,
   wherein a plurality of gas supply ports are connected to the upper chamber,
   wherein a plurality of exhaust ports are connected to the lower chamber,
   wherein each of the gas supply ports is connected to a gas supply pipe and is configured to provide an inert gas into the upper space,
   wherein each of the exhaust ports is connected to an exhaust pipe and is configured to exhaust a gas of the lower space,
   wherein the chamber comprises a top wall, a bottom wall, and a side wall between the top wall and the bottom wall,
   wherein the side wall includes first to fourth side walls and has an open top end and an open bottom end,
   wherein the first and third side walls face each other,
   wherein the second and fourth side walls face each other and are substantially perpendicular to the first and third side walls,
   wherein the plurality of gas supply ports comprise:
   first and second spaced apart gas supply ports adjacent upper corners of the first side wall; and
   third and fourth spaced apart gas supply ports adjacent upper corners of the third side wall.

8. The apparatus of claim 7, wherein the first and third side walls face each other in a first direction,
   wherein each of the first and third side walls has a length along a second direction intersecting the first direction and a height along a third direction perpendicular to the first and second directions,
   wherein the first gas supply port is tilted downwardly toward a center of the upper space so as to be parallel to a fourth direction,
   wherein the second gas supply port is tilted downwardly toward the center of the upper space so as to be parallel to a fifth direction,
   wherein the third gas supply port is tilted downwardly toward the center of the upper space so as to be parallel to a sixth direction,
   wherein the fourth gas supply port is tilted downwardly toward the center of the upper space so as to be parallel to a seventh direction, and
   wherein each of the fourth to seventh directions is not parallel to the first to third directions.

* * * * *